United States Patent
Yang

(10) Patent No.: US 7,265,027 B2
(45) Date of Patent: Sep. 4, 2007

(54) BOND METHOD AND STRUCTURE USING SELECTIVE APPLICATION OF SPIN ON GLASS

(75) Inventor: Xiao Yang, Cupertino, CA (US)

(73) Assignee: Miradia Inc., Sunnyvale, CA (US)

( * ) Notice: Subject to any disclaimer, the term of this patent is extended or adjusted under 35 U.S.C. 154(b) by 0 days.

(21) Appl. No.: 11/152,973

(22) Filed: Jun. 14, 2005

(65) Prior Publication Data

US 2006/0281227 A1  Dec. 14, 2006

(51) Int. Cl.
*H01L 21/301* (2006.01)

(52) U.S. Cl. .................. 438/456; 438/106; 438/113; 257/E21.499

(58) Field of Classification Search ............. 438/455, 438/118, 456, 113, 110, 106; 257/704, E21.499
See application file for complete search history.

(56) References Cited

U.S. PATENT DOCUMENTS

| | | | |
|---|---|---|---|
| 3,997,964 A | | 12/1976 | Holbrook et al. |
| 4,213,074 A | * | 7/1980 | Kawaguchi et al. ........ 313/509 |
| 5,139,998 A | * | 8/1992 | Eddy et al. ................ 118/715 |
| 5,830,527 A | * | 11/1998 | Vickers ...................... 216/11 |
| 5,907,477 A | * | 5/1999 | Tuttle et al. ................ 361/760 |
| 6,048,399 A | * | 4/2000 | Tan et al. ................... 118/320 |
| 6,093,623 A | | 7/2000 | Forbes |
| 6,094,142 A | * | 7/2000 | Lu ............................. 340/626 |
| 6,294,439 B1 | | 9/2001 | Sasaki et al. |
| 6,343,171 B1 | * | 1/2002 | Yoshimura et al. ........... 385/50 |
| 6,417,075 B1 | | 7/2002 | Haberger et al. |
| 6,653,210 B2 | | 11/2003 | Choo et al. |
| 6,664,503 B1 | | 12/2003 | Hsieh et al. |
| 2001/0053535 A1 | * | 12/2001 | Bashir et al. .................. 435/34 |
| 2005/0208777 A1 | * | 9/2005 | Kato et al. ................... 438/781 |
| 2005/0247990 A1 | * | 11/2005 | Cheng ........................ 257/432 |

* cited by examiner

*Primary Examiner*—Michelle Estrada
*Assistant Examiner*—Jarrett J. Stark
(74) *Attorney, Agent, or Firm*—Townsend and Townsend and Crew LLP

(57) ABSTRACT

A method for bonding substrate structures. The method includes providing a transparent substrate structure, the transparent substrate structure comprising a face region and an incident light region, providing a spacer structure, the spacer structure comprising a selected thickness of material, the spacer structure having a spacer face region and a spacer device region, and providing a device substrate structure, the device substrate having a device face region and a device backside region. The method further includes applying a first glue material to the spacer face region and bonding the spacer face region to the face region of the transparent substrate structure. The method also includes applying a second glue material to the spacer device region and bonding the spacer device region to the device face region.

20 Claims, 11 Drawing Sheets

BOND METHOD AND STRUCTURE USING SELECTIVE APPLICATION OF SPIN ON GLASS

BACKGROUND OF THE INVENTION

The present invention relates generally to packaging techniques. More particularly, the invention includes a method and structure for packaging optical devices using selective application of spin on glass for bonded substrates. Merely by way of example, the invention has been applied to integrating a mechanical based structure with an integrated circuit chip. But it would be recognized that the invention has a much broader range of applicability.

Visual display technologies have rapidly developed over the years. Most particularly, electronic displays for outputting television shows, streaming video, and the like. From the early days, cathode ray tube technology, commonly called CRTs, outputted selected pixel elements onto a glass screen in conventional television sets. These television sets originally output black and white moving pictures. Color television sets soon replaced most if not all black and white television units. Although very successful, CRTs were often bulky, difficult to make larger, and had other limitations.

CRTs were soon replaced, at least in part, with liquid crystal panel displays. These liquid crystal panel displays commonly called LCDs used an array of transistor elements coupled to a liquid crystal material and a color filter to output moving pictures in color. Many computer terminals and smaller display devices often relied upon LCDs to output video, text, and other visual features. Unfortunately, liquid crystal panels often had low yields and were difficult to scale up to larger sizes. These LCDs were often unsuitable for larger displays often required for television sets and the like.

Accordingly, projection display units have been developed. These projection display units include, among others, a counterpart liquid crystal display, which outputs light from selected pixel elements through a lens to a larger display to create moving pictures, text, and other visual images. Another technology is called "Digital Light Processing" (DLP), which is a commercial name from Texas Instruments Incorporated (TI) of Texas, USA. DLP is often referred to as the use of "micro-mirrors." DLP relies upon a few hundred thousand tiny mirrors, which line up in 800 rows of 600 mirrors each. Each of the mirrors is hinged. An actuator is attached to each of the hinges. The actuator is often electrostatic energy that can tilt each of the mirrors at high frequency. The moving mirrors can modulate light, which can be transmitted through a lens and then displayed on a screen. Although DLP has been successful, it is often difficult to manufacture and subject to low yields, etc. DLP is also manufactured using micro-electromechanical systems (MEMS) based processing techniques. Such MEMS based processing techniques are often costly and difficult to scale up for efficient processing. More specifically, packaging techniques used for MEMS are also difficult and costly to scale up.

From the above, it is seen that an improved technique for packaging devices is desired.

SUMMARY OF THE INVENTION

According to the present invention, techniques for packaging optical devices are provided. More particularly, the invention includes a method and structure for packaging optical devices using selective application of spin on glass for bonded substrates. Merely by way of example, the invention has been applied to integrating a mechanical based structure with an integrated circuit chip. But it would be recognized that the invention has a much broader range of applicability.

In a specific embodiment of the present invention, a method for bonding substrate structures is provided. The method includes providing a transparent substrate structure, the transparent substrate structure comprising a face region and an incident light region, providing a spacer structure, the spacer structure comprising a selected thickness of material, the spacer structure having a spacer face region and a spacer device region, and providing a device substrate structure, the device substrate having a device face region and a device backside region. The method further includes applying a first glue material to the spacer face region and bonding the spacer face region to the face region of the transparent substrate structure. The method also includes selectively applying a second glue material to the spacer device region and bonding the spacer device region to the device face region.

In another specific embodiment of the present invention, a bonded substrate package is provided. The bonded substrate package includes a device substrate structure comprising a device region and a base region, the device region comprising a plurality of arrays of moveable mirrors and a plurality of electrical contacts and a spacer structure coupled to the device substrate structure, the spacer structure comprising a plurality of standoffs, each standoff defined by a face region and a device region. The bonded substrate package also includes a first spin on glass (SOG) interface layer disposed between the device region of the device substrate structure and the device region of each standoff, the first SOG interface layer making contact with a predetermined portion of the device region of each standoff. The bonded substrate package further includes a transparent substrate bonded to the spacer structure, the transparent substrate comprising a face region and an incident light region and a second SOG interface layer disposed between the face region of each standoff and the face region of the transparent substrate.

In yet another embodiment of the present invention, a method for bonding multiple substrates is provided. The method includes providing a handle substrate, the handle substrate comprising a face region and an incident light region, providing a spacer substrate, the spacer substrate having a spacer face region and a spacer device region, and providing a device substrate, the device substrate having a device face region and a device backside region. The method further includes providing a first conformal coating on the spacer face region and bonding the spacer face region to the face region of the handle substrate. The method also includes providing a second conformal coating on the spacer device region and bonding the spacer device region to the device face region.

Many benefits are achieved by way of the present invention over conventional techniques. For example, the present technique provides an easy to use process that relies upon conventional technology. In some embodiments, the method provides higher device yields for the bonded substrates. Additionally, the method provides a process that is compatible with conventional process technology without substantial modifications to conventional equipment and processes. Preferably, the invention provides for an improved integrated structure including integrated circuits and mirror structures for display applications. In preferred embodiments, the present method provides a batch process, which can produce high throughput and yields. Moreover, device reliability is increased as a result of reduced outgassing and particle production. Additionally, the effects of thermal mismatch between materials are reduced through use of embodiments of the present invention.

Generally, SOG layers applied between substrates are characterized by submicron thicknesses, which results in reduced interfacial stress due to intrinsic or thermal mismatch. Reductions in stress may produce less wafer bow and less warping of the die, ultimately leading to improved optical performance and device reliability. Additionally, SOG is generally compatible with CMOS processes and does not lead to package contamination. Bonding temperatures for interfacial bonds formed using SOG are relatively low (e.g., 200° C.-300° C.) compared to alternative bonding processes at higher temperatures. Moreover, embodiments of the present invention provide methods to coat both sides of a substrate, enabling the assembly of triple stacked substrates. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF SPECIFIC EMBODIMENTS

According to the present invention, techniques for packaging optical devices are provided. More particularly, the invention includes a method and structure for packaging optical devices using selective application of spin on glass for bonded substrates. Merely by way of example, the invention has been applied to integrating a mechanical based structure with an integrated circuit chip. But it would be recognized that the invention has a much broader range of applicability.

Figure 1:
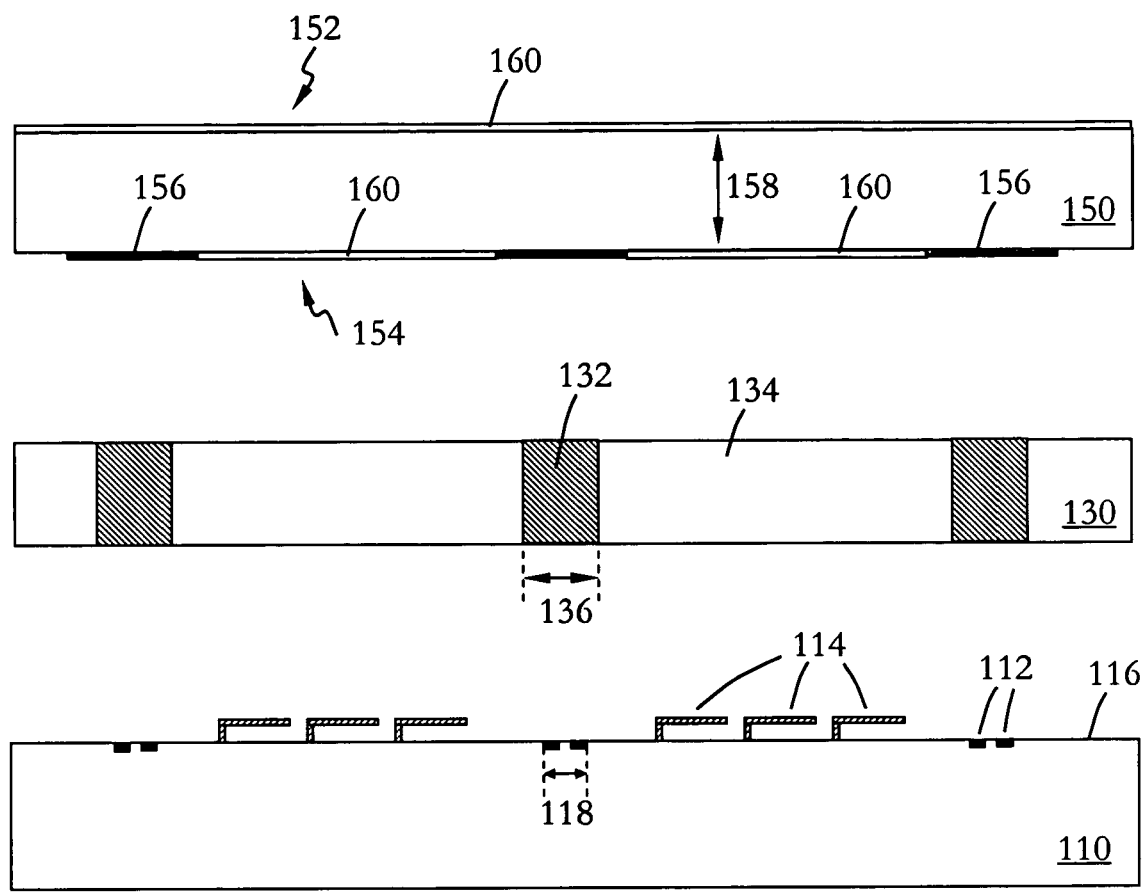
FIG. 1 is a simplified cross-sectional diagram illustrating components of a spatial light modulator according to one embodiment of the present invention.

FIG. 1 is a simplified cross-sectional diagram illustrating components of a spatial light modulator (SLM) according to one embodiment of the present invention. The following diagrams are merely examples, which should not unduly limit the scope of the claims herein. One of ordinary skill in the art would recognize many variations, alternatives, and modifications. As illustrated in FIG. 1, a number of arrays of spatial light modulators are present on one surface of a CMOS substrate 110. As illustrated, arrays of micro-electromechanical system (MEMS) devices 114 are present on a device surface 116 of CMOS substrate 110. In a particular embodiment, the MEMS devices are micro-mirrors actuated by electrodes (not shown) coupled to the device surface of the CMOS substrate. An example of a CMOS substrate and micro-mirrors according to embodiments of the present invention is described in U.S. patent application Ser. No. 10/756,936, filed Jan. 13, 2004, commonly owned, and hereby incorporated by reference for all purposes. Bond pads 112 are also present on the device surface of the CMOS substrate. As illustrated, the combined width 118 of the bond pads, measured from edge to edge, is a predetermined width. As more fully described in the above referenced application, the bond pads provide for electrical connection between the integrated circuitry formed on the CMOS wafer and external drive electronics, among other uses.

In some embodiments of the present invention, the CMOS substrate surface is prepared in order to provide bonding surfaces on the device surface of the CMOS substrate. One example of such methods and structures compatible with wafer bonding of substrates is described in co-pending and commonly owned U.S. patent application Ser. No. 11/028,946, filed Jan. 3, 2005, which is incorporated by reference for all purposes.

In one embodiment, after formation of CMOS circuitry, including electrodes, a layer of a first thickness is deposited on the device substrate. In a particular embodiment, the deposited layer is a silicon dioxide ($SiO_2$) layer, but this is not required by the present invention. Other suitable materials may be used within the scope of the present invention. For example, the deposited layer is formed by deposition of silicon nitride ($Si_3N_4$), silicon oxynitride (SiON), or polysilicon layers, including amorphous polysilicon, in yet another alternative embodiment according to the present invention.

Generally, a chemical mechanical polishing (CMP) step is performed to planarize the upper surface of the deposited layer. The CMP process reduces the thickness of the deposited layer to a second thickness less than the first thickness, resulting in a highly polished and planaraized layer. In a particular embodiment, the root-mean-square (RMS) roughness of the planarized surface is less than or equal to about 5 Å. As will be described below, the extremely smooth surface produced during the CMP process facilitates bonding of the spacer structure to the device substrate structure.

After the CMP step, a photolithography process is generally performed in which a photoresist layer is deposited and patterned to form an etch mask on surface of the polished deposited layer. The photolithography process is well known as will be evident to one of ordinary skill in the art. In a specific embodiment, an etch mask of metal such as Al or TiN is utilized to remove selected portions of the deposited layer to form bonding regions on the device surface 116 of the device substrate structure.

In some embodiments of the present invention, the processes used to deposit, pattern, and etch the deposited layer or layers from which the bonding regions are fabricated is performed at low temperatures. For example, these processing steps may be performed with a view to the structures present on the device substrate prior to the formation of the bonding regions, such as CMOS circuitry. Since some CMOS circuitry may be adversely impacted by performing high temperature deposition processes, which may damage metals coupling CMOS transistors or result in diffusion of junctions associated with the CMOS circuitry, low temperature deposition processes are utilized according to some embodiments of the present invention. Moreover, in a particular embodiment of the present invention, low temperature deposition, patterning, and etching processes, such as processes performed at temperatures of less than 500° C., are used to form the layer or layers from which the bonding regions are fabricated. In another specific embodiment, deposition, patterning, and etching processes performed at less than 400° C., are used to form the layer from which the bonding regions are fabricated. One of ordinary skill in the art would recognize many variations, modifications, and alternatives within the scope of low temperature processes.

Figure 2:
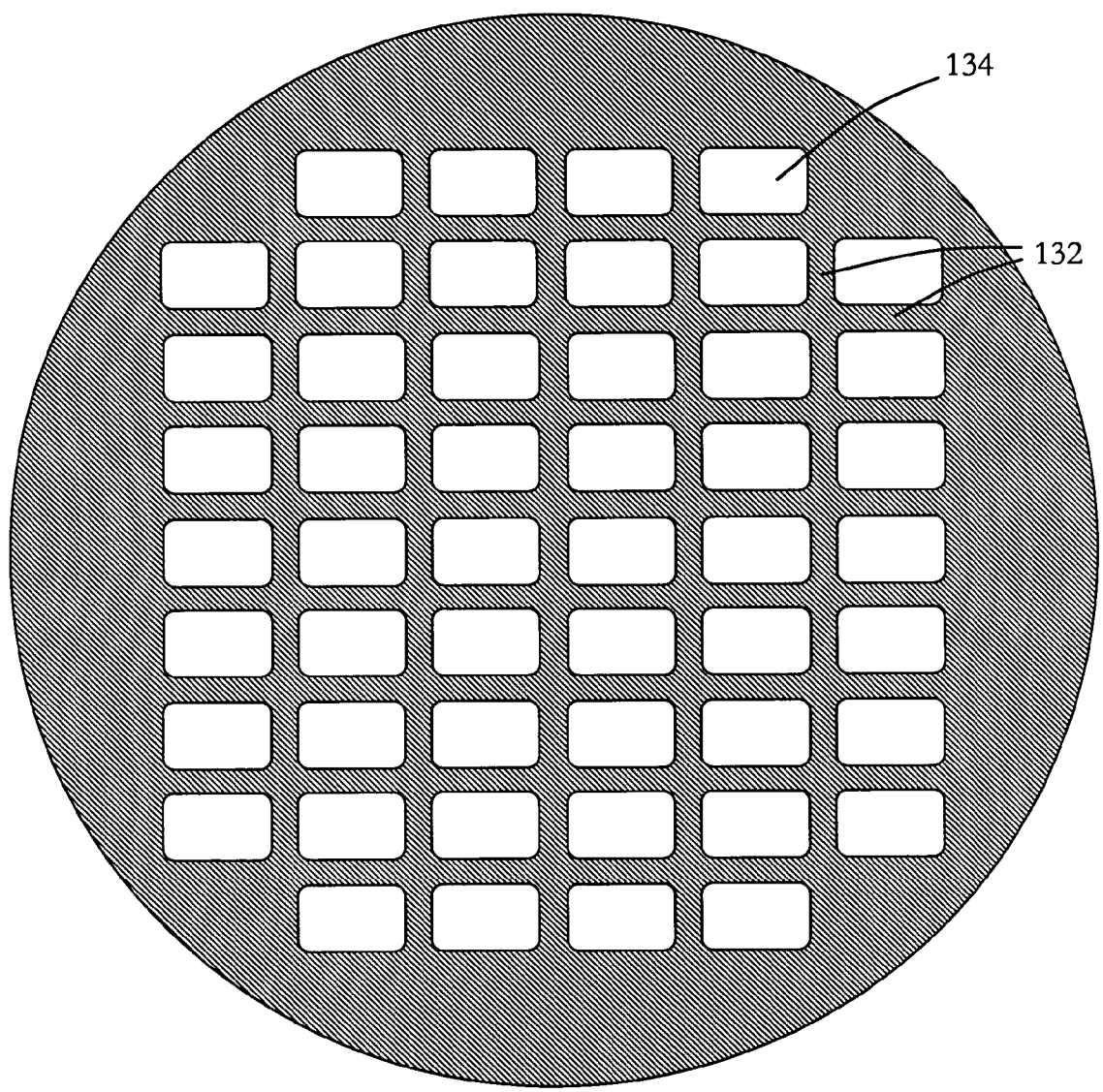
FIG. 2 is a simplified top-view illustration of a spacer structure according to an embodiment of the present invention.

As further illustrated in FIG. 1, a spacer structure 130 is provided. The spacer structure includes a number of open regions or windows 134 bounded by standoff regions 132. FIG. 2 is a simplified top-view illustration of a spacer structure according to an embodiment of the present invention. As illustrated in FIG. 2, a number of generally rectangular windows 134 are bounded on all sides by standoff regions 132 arrayed in horizontal and vertical directions. As illustrated in FIGS. 1 and 2, each of the windows 134 are positioned to align with an array of MEMS devices 114. The generally rectangular shape of the windows illustrated in FIG. 2 enables the MEMS devices to be arrayed, in a specific embodiment of the present invention, in a rectangular two-dimensional array of 1,920 mirrors by 1,080 mirrors, each mirror being 15 μm on a side. Moreover, in alternative embodiments, other numbers of mirrors of differing sizes are utilized.

The spacer structure 130 is fabricated from materials characterized by suitable durability, rigidity, and selected thermal properties. For example, in one embodiment, the spacer structure is fabricated from a silicon substrate 725 μm thick. In alternative embodiments, the spacer structure is a compound silicon-on-insulator (SOI) substrate including a silicon layer sandwiched between silicon oxide insulating layers. Openings 134 are typically formed using a masking and etching process, although this is not required by the present invention. In other embodiments, the openings are formed by grit blasting, ion milling, or other suitable methods.

As illustrated in FIGS. 1 and 2, the width 136 of the standoff regions is a predetermined width. In one embodiment, the width of the standoff regions, measured in both horizontal and vertical directions at center points of the windows 134, is uniform and equal to 1.0 mm. In alternative embodiments, the width varies from about 0.2 mm to about 10 mm. In yet other embodiments, the width of the standoff regions differs in the horizontal and vertical directions (as illustrated in FIG. 2) as appropriate to a particular application.

A handle substrate 150 is also illustrated in FIG. 1. In some embodiments of the present invention, the handle substrate is a transparent substrate. In the embodiment illustrated in FIG. 1, the transparent substrate 150 has a predetermined thickness 158. In an embodiment according to the present invention, the thickness of the transparent member is 1.1 mm. Alternatively, the thickness ranges from about 0.7 mm to about 3.0 mm in other embodiments. Of course, the thickness will depend upon the particular applications.

In an embodiment according to the present invention, the transparent substrate is a product sold under the name of Corning Eagle$^{2000}$™ display grade glass substrate manufactured by Corning Incorporated of Corning, N.Y. The glass substrate is characterized by high optical quality, including, but not limited to, optical power transmittance in the visible region of greater than 90%. The transmittance of light through the substrate can be increased by the application of anti-reflection (AR) coatings to the optical surfaces of the substrate, as disclosed below. Additionally, Corning Eagle$^{2000}$™ display grade glass is used in some embodiments according to the present invention because the coefficient of thermal expansion of the glass substrate is close to the coefficient of thermal expansion of silicon.

In the embodiment illustrated in FIG. 1, the transparent substrate is designed and fabricated to reduce optical absorption and thereby increase the transmission of optical energy at the wavelength range of interest. In an embodiment according to the present invention, the wavelength range of interest is the visible spectrum between 400 and 700 nm. Additionally, in this embodiment, the top surface 152, sometimes referred to as an incident light region, and the bottom surface 154, sometimes referred to as a face region, of the substrate 150 are polished or finished to provide optical quality surfaces.

Moreover, AR coatings 160 may be applied to the incident light and face regions of the transparent substrate. The AR coatings applied to the incident light surface will reduce the amount of light reflected off the top of the transparent substrate as it impinges on the package and thereby increase the amount of light that reaches the MEMS arrays 114. Moreover, AR coatings applied to the face region of the transparent member will reduce the amount of light reflected at this interface as reflected light leaves the package. Thus, overall system throughput will be increased by the use of these AR coatings. Quarter wave ($\lambda$/4) coatings of $MgF_2$ or other suitable dielectric materials can be used to form broadband AR coatings. For example, a $\lambda$/4 $MgF_2$ coating centered at 550 nm (with an index of refraction of 1.38 at 550 nm) deposited on a Corning Eagle$^{2000}$™ display grade glass substrate, results in a power reflectance less than 2% per surface across the visible spectrum (400-700 nm).

As illustrated in FIG. 1, in addition to AR coatings on the incident light and face regions of the transparent substrate, light-blocking regions 156 are placed on selected portions of the face region of the transparent substrate. In one embodiment, the light-blocking regions are fabricated by depositing a suitable light-blocking material on predetermined portions of the transparent substrate. In a specific embodiment, the light-blocking material is black chrome. As is well known to one of ordinary skill in the art, chromium plating or chrome is used in a variety of applications. Chrome coatings may be doped with light absorbing materials to produce a "black" or absorbing spectral profile. These or other suitable light-blocking coatings are provided by embodiments of the present invention. One of ordinary skill in the art would recognize many variations, modifications, and alternatives.

Generally, one or more steps in the process of fabricating a integrated spatial light modulator involve the bonding of the substrates and structures illustrated in FIGS. 1 and 2 to form an integrated spatial light modulator package. Some bonding techniques are limited in their applicability due to the differing nature of the materials illustrated in FIGS. 1 and 2. For example, in a process in which a light-blocking region of black chrome is bonded to standoff regions of the spacer structure comprising silicon, the bond strength and reliability may be adversely impacted by the dissimilar nature of these materials. Moreover, in some processes, undesirable bonding may occur at selected portions of the integrated structure. An example of undesirable bonding is the formation of a strong bond at the interface between the standoff regions and the bond pads. In this example, bonding of the standoff regions to the bond pads may adversely impact the ability of an operator to connect the bond pads to external drive electronics.

Figure 3A:
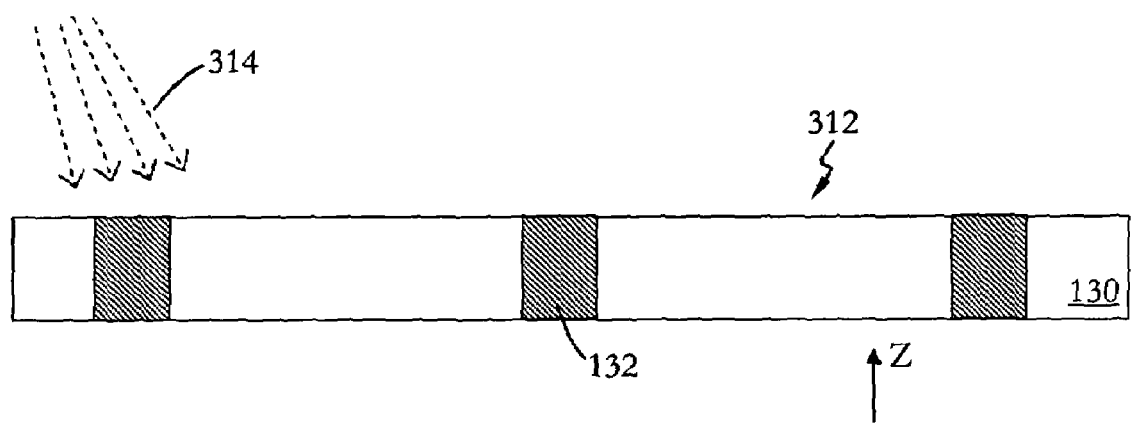
FIGS. 3A and 3B are simplified cross-sectional diagrams illustrating a first spray coating process according to an embodiment of the present invention.
Figure 3B:
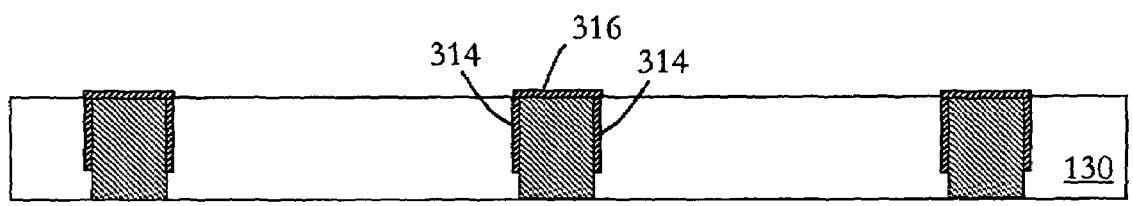

FIGS. 3A and 3B are simplified cross-sectional diagrams illustrating a spray coating process according to an embodiment of the present invention. As illustrated in FIG. 3A, a first glue material is applied to a first side (spacer face region) 312 of the spacer structure 130 as the spacer structure is rotated about an axis. In the embodiment illustrated in FIG. 3A, the first glue material is applied to the spacer face region of the standoff structure as a spray coating. Merely by way of example, an EVG101 Advanced Resist Processing System, manufactured by EV Group of Schärding, Australia, may be utilized in the spray coating dispense mode. In a particular embodiment, the first glue material is a spin on glass (SOG), comprising silicon dioxide ($SiO_2$) suspended in a solvent solution. As illustrated in FIG. 3A, the first glue material 314 is dispensed at an angle with respect to the spacer structure in a spray coating mode. The spacer structure is rotated about the z-axis during the spray coating step, resulting in the deposition of first glue material on the upper (spacer face) surface 316 of the standoffs 132 as well as the side surfaces 314 of the standoffs as illustrated in FIG. 3B.

In embodiments of the present invention, the thickness of the SOG layer is a predetermined thickness. For example, in one embodiment, the thickness of the SOG layer is 0.3 µm. In alternative embodiments, the thickness ranges from 0.1 µm to 1.0 µm. Of course, the thickness of the SOG layer will depend on the particular applications. The thickness of the SOG layer will depend, in part, on the rotation speed at which the spacer structure is rotated. In embodiments of the present invention, the rotation speed of the spacer structure is a predetermined value. For example, in one embodiment, the spacer structure is rotated at 100 RPM. In alternative embodiments, the rotation speed ranges from 10 RPM to 1000 RPM. In yet other embodiments, the rotation speed varies as a function of spray coating time. Of course, the selection of the rotation speed, either constant or variable, will depend on the particular applications.

In embodiments of the present invention utilizing SOG, the SOG layer is cured or annealed after application by spray coating. The curing process removes the solvents contained in the liquid SOG solution and polymerizes the SOG layer through the application of heat. Typically, curing is performed using direct-contact hot plates or in batch furnaces, although in some applications, curing is performed using noncontact curing systems. One of ordinary skill in the art would recognize many variations, modifications, and alternatives. In a particular embodiment, the SOG layer is cured on a hot plate at a temperature of 120° C. for a period of 2 minutes. Of course, the specific process parameters will depend on the particular applications.

Figure 4:
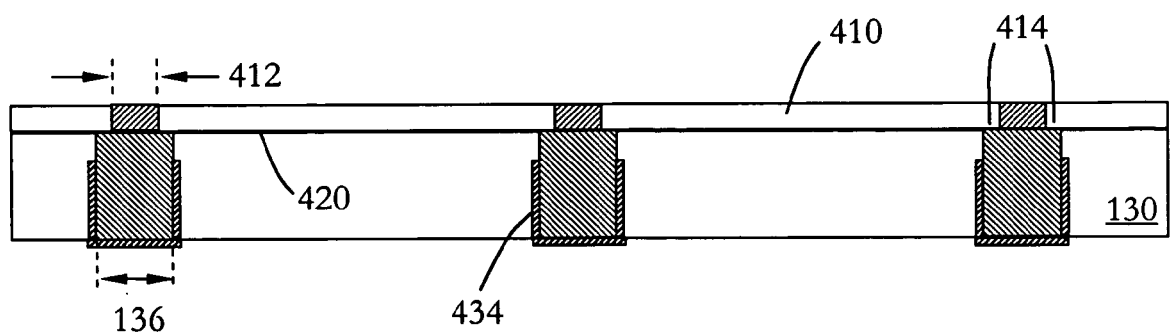
FIG. 4 is a simplified cross-sectional diagram illustrating the use of a shadow mask according to an embodiment of the present invention.

FIG. 4 is a simplified cross-sectional diagram illustrating the use of a shadow mask according to an embodiment of the present invention. As illustrated in the figure, a shadow mask 410 is placed in contact with the spacer device region 420 of the spacer structure 130. In some embodiments of the present invention, the shadow mask is a metal structure with a two-dimensional structure correlated to the two-dimensional structure of the spacer structure as illustrated in FIG. 2. For example, in a specific embodiment, the shadow mask includes vertical and horizontal features that align with, and are narrower, than the standoff regions 132 illustrated in FIG. 2. Thus, as illustrated in the cross-sectional diagram of FIG. 4, the width 412 of individual shadow mask features is less than the width 136 of the standoff regions with which the shadow mask features are aligned. Thus, in the embodiment illustrated in FIG. 4, the solid features of the shadow mask partially cover the spacer face region, leaving portions 414 of the spacer face region exposed.

In embodiments according to the present invention, the width of the shadow mask is a predetermined width. Merely by way of example, in one embodiment, the width of the shadow mask is uniform in horizontal and vertical directions and is equal to 2 mm. In alternative embodiments, the width of the shadow mask is dissimilar in horizontal and vertical dimensions, as required by particular applications. Generally, the shadow mask is aligned to the spacer structure and the two structures are clamped together. The tolerance for alignment is generally in the range of 10 µm and clamping of the structure is accomplished using methods well known to one of skill in the art.

The shadow mask is fabricated from materials characterized by suitable durability, rigidity, and surface properties. For example, in one embodiment, the shadow mask is fabricated from a metal plate 1 mm thick. In alternative embodiments, the shadow mask is a compound structure including either multiple metal layers or composite layers of metals and ceramic. In yet additional embodiments, the shadow mask is fabricated from a first material and subsequently coated with a second material. Openings in the shadow mask are typically formed using a masking and etching process, although this is not required by the present invention. In other embodiments, the openings are formed by grit blasting, ion milling, or other suitable methods.

Figure 5:
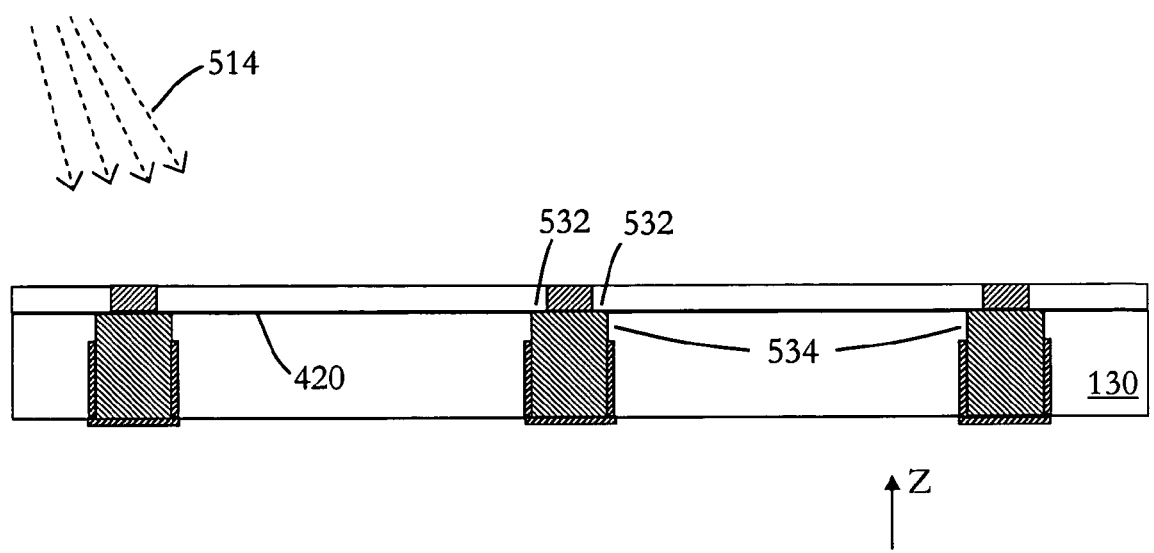
FIG. 5 is a simplified cross-sectional diagram illustrating a second spray coating process according to an embodiment of the present invention.

FIG. 5 is a simplified cross-sectional diagram illustrating a second spray coating process according to an embodiment of the present invention. As illustrated in FIG. 5, a second glue material 514 is applied to the spacer device region 420 of the standoff structure and the shadow mask as the spacer structure is rotated about an axis. In the embodiment illustrated in FIG. 5, the second glue material is applied to the standoff structure as a spray coating. Merely by way of example, an EVG101 Advanced Resist Processing System, manufactured by EV Group of Schärding, Australia, may be utilized in the spray coating dispense mode. In a particular embodiment, the second glue material is a spin on glass (SOG), comprising silicon dioxide ($SiO_2$) suspended in a solvent solution. As illustrated in the figure, the SOG is dispensed at an angle with respect to the spacer structure and the shadow mask in a spray coating mode. The embodiment illustrated in FIG. 5, the spacer structure and shadow mask are rotated about the z-axis during the spray coating step, resulting in the deposition of SOG on the spacer device region 532 of the standoff structure and the top and sides of the shadow mask. Additionally, the SOG is deposited on the side surfaces 534 of the standoffs.

In some embodiments of the present invention, the second glue material does not adhere to the shadow mask. Merely by way of example, shadow masks fabricated with a Teflon® outer coating provide a non-stick surface with respect to SOG. Teflon® is manufactured by Dupont Incorporated of Wilmington, Del. Other coatings and materials useful to reduce the amount of glue material adhering to the shadow mask will be apparent to one of skill in the art. In embodiments in which the SOG does not adhere to the shadow mask, curing of the SOG may be performed with the shadow mask attached to the spacer structure.

In alternative embodiments, the shadow mask is removed prior to curing of the second glue material. Thus, second glue material adhering to the shadow mask is removed along with the shadow mask while preserving the layer of second glue material in contact with the device region of the spacer structure. In these embodiments, the viscosity of the SOG layer prevents the liquid SOG from migrating significantly into the areas covered by the shadow mask prior to curing. In yet other alternative embodiments, the curing process for the SOG applied to the spacer device region is performed as a two-step process in which the curing process is partially performed prior to removal of the shadow mask and completed after the shadow mask is removed. Accordingly, as illustrated in FIG. 5, in some embodiments of the present invention, the second glue material is selectively applied to a predetermined region of the spacer device region 420 of the spacer structure. In a specific embodiment, the predetermined region of the spacer structure is a portion of the spacer device region defined by openings in a shadow mask.

Figure 6:
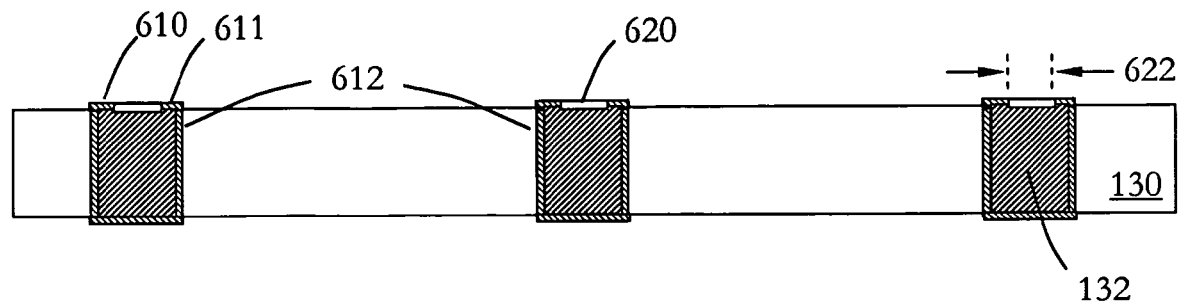
FIG. 6 is a simplified cross-sectional diagram illustrating a standoff structure after removal of a shadow mask according to an embodiment of the present invention.

FIG. 6 is a simplified cross-sectional diagram illustrating a standoff structure after removal of a shadow mask according to an embodiment of the present invention. As illustrated in FIG. 6, the standoff structures are encapsulated in SOG with the exception of a contact region 620 on the device region of the spacer structure. In some embodiments, the width 622 of the contact region is selected to be equal to the combined width 118 of the bond pads 112 as illustrated in FIG. 1. In alternative embodiments, the width of the contact region is greater than the combined width of the bond pads. The side surfaces 612 of the standoff structures, coated with glue material during the application of the first glue materials and the second glue material are completely coated as a result of the two coating processes. As described more fully below, the coating of the side surfaces provides for passivation of the standoff regions.

In specific embodiments of the present invention, the thickness of the SOG layer deposited during the second spray coating process is a predetermined thickness. For example, in one embodiment, the thickness of the SOG layer is 0.3 μm. In alternative embodiments, the thickness ranges from 0.1 μm to 1.0 μm. Of course, the thickness of the SOG layer will depend on the particular applications. The thickness of the SOG layer will depend, in part, on the rotation speed at which the spacer structure is rotated. In embodiments of the present invention, the rotation speed of the spacer structure is a predetermined value. For example, in one embodiment, the spacer structure is rotated at 100 RPM. In alternative embodiments, the rotation speed ranges from 10 RPM to 1000 RPM. In yet other embodiments, the rotation speed varies as a function of spray coating time. Of course, the selection of the rotation speed, either constant or variable, will depend on the particular applications. In some embodiments, the SOG forms a conformal coating on the surface to which it is attached, but this is not required by the present invention.

Comparison of FIGS. 1, 2, 5, and 6 will illustrate the two-dimensional shape defined by the contact regions. For example, generally, the shape of the contact regions is correlated with the two-dimensional shape of the shadow mask. In a particular embodiment, the width of the contact region 622 is less than the width 136 of the standoff structure 132, providing bonding sections 610 and 611 on the device region of the spacer structure coated with the second glue material. As illustrated in FIG. 6, the bonding sections 610 and 611 are equal in width and straddle the contact region 620. In a specific embodiment of the present invention, the width of the contact regions is uniform in horizontal and vertical directions (as illustrated in FIG. 2) and is equal to 2.0 mm. In alternative embodiments, the width of the contact regions is dissimilar in horizontal and vertical dimensions, as required by particular applications.

As illustrated in the previously discussed embodiments, the first glue material and the second glue material may be dissimilar or similar. For example, in one embodiment, the first and second glue material are basically identical formulations of SOG. However, in alternative embodiments, the formulations of the SOG used in the two deposition processes are varied to achieve different SOG thicknesses or material compositions on opposite sides of the spacer structure. Merely by way of example, as discussed more fully below, the bonding processes applied to either side of the spacer structure may benefit from SOG layers with different thicknesses or material compositions on each side of the spacer structure. In these bonding processes, the spin rate of the spacer structure, the composition of the SOG solution, or combinations of these, and the like, are modified to achieve desired SOG layer properties on either side of the spacer structure. Moreover, although embodiments utilizing SOG as the first and second glue materials have been described, the use of SOG is not required by the present invention. One of ordinary skill in the art would recognize many variations, modifications, and alternatives.

Figure 7:
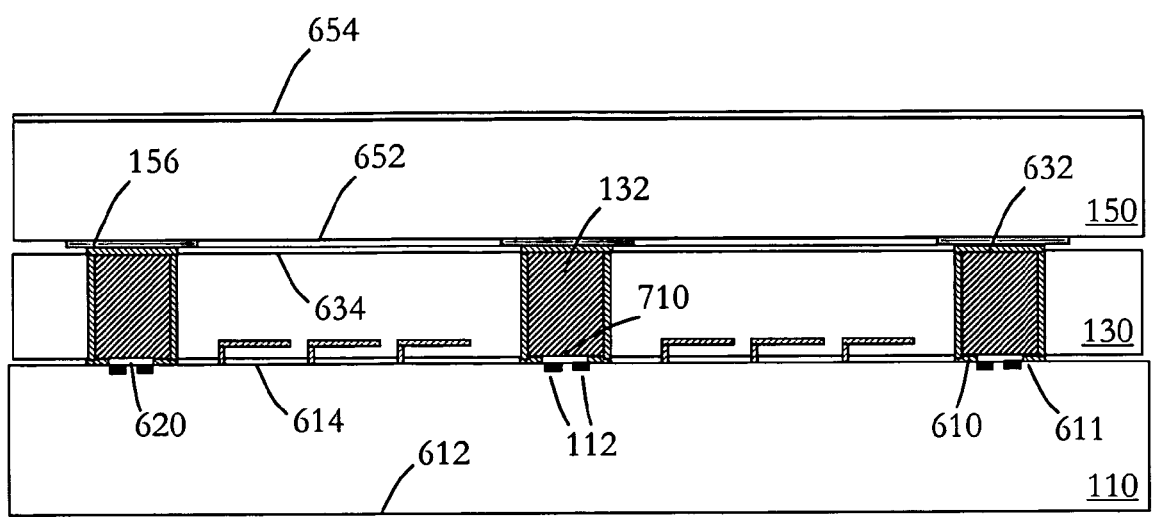
FIG. 7 is a simplified cross-sectional diagram illustrating a bonding process according to an embodiment of the present invention.

FIG. 7 is a simplified cross-sectional diagram illustrating a bonding process according to an embodiment of the present invention. As illustrated in FIG. 7, the device substrate structure, the spacer structure, and the transparent substrate are joined by a bonding process to form a bonded substrate structure. In the embodiment of the present invention illustrated in FIG. 7, the spacer structure is positioned with the device region adjacent the device face 614 of the device substrate structure. In particular, the bond pads 112 on the device face of the device substrate structure are aligned with the contact regions 620 on the device region of the spacer structure. Accordingly, the bonding sections 610 and 611 are positioned to straddle both the bond pads and the contact regions. As described more fully below, a hermetic seal is formed at the interface between the device face of the device substrate structure and the second glue material present on the bonding sections of the device face of the spacer structure. As illustrated, a portion 710 of the standoff structures 132 is not attached to the bond pads or the device substrate structure during the bonding process.

Moreover, as illustrated in FIG. 7, the handle substrate is positioned with the face region 652 of the handle substrate adjacent the face region 634 of the spacer structure. In particular, the standoff structures 132 are aligned with the light-blocking regions 156 of the handle substrate. As described more fully below, a hermetic seal is formed at the interface between the first glue material present on the spacer face region of the standoff structures and the light-blocking regions on the face region of the of the handle substrate.

Hermetic sealing of the various substrates is performed according to several methods well known to those skilled in the art. For example, in an embodiment according to the present invention, hermetic sealing is performed by plasma activated covalent wafer bonding (PACWB). PACWB is performed at room temperature after the device substrate structure, the spacer structure, and the handle substrate have been cleaned, for example, in SC1 ($NH_3$:$H_2O_2$:$H_2O$, 1:4:20) at 60° C., rinsed in de-ionized (DI) water, dipped in 2% HF for 20 seconds, rinsed in DI water and dried with $N_2$ or air. The device substrate structure, the spacer structure, and the handle substrate are then exposed, for example, to an oxygen plasma in a reactive ion etcher at a chamber pressure of about 35 mTorr.

In an alternative embodiment according to the present invention, the device substrate structure, the spacer structure, and the handle substrate are exposed to an argon plasma. In one embodiment, after plasma treatment, the surface of the SOG is hydrophilic, promoting bonding. The device substrate structure, the spacer structure, and the handle substrate are brought into contact at room temperature in a preselected ambient environment. In alternative embodiments according to the present invention, other bonding techniques are used, for example, eutectic low temperature bonding and anodic bonding. In some embodiments according the present invention, the presence of the layers comprising glue material at the hermetically sealed interfaces improves the quality and reliability of the hermetic seal formed at these interfaces. Merely by way of example, the use of SOG as the glue material provides layers characterized by planarity and composition suitable for a variety of hermetic bonding processes.

In an embodiment according to the present invention, the hermetic sealing process illustrated in FIG. 7 is performed in an environment comprising inert gases. Examples of inert gases are $N_2$ and Ar, among others. The benefits provided by hermetic sealing in an inert environment include, but are not limited to dampening of oscillations present in the devices and the prevention of electrical arcing. For example, if the devices are micro-mirrors arranged in an array, oscillations present during operation and motion of the micro-mirrors are damped and attenuated by the presence of the inert gas. Additionally, the possibility of electrical arcing between the elements of the micro-mirror array and/or the drive electronics is reduced by the presence of the inert gas.

As illustrated in FIG. 7, the first glue material and the second glue material provide a coating that encapsulates the standoff structures on the face surface, the device surface, and the surface facing the MEMS 614. Viewed in three dimensions, the combination of the first and second glue materials provide a annular coating on the inner portions of the standoff structures. In embodiments, in which the first and second glue materials are SOG, a coating of glass is formed on the vertical walls of the standoff structures surrounding the MEMS devices. In some embodiments, the SOG coating provides a sealant that exhibits reduced flaking and out-gassing, preserving the hermetically sealed environment present inside the chamber 1032. Device reliability and lifetime improvements resulting from preservation of the hermetically sealed environment will be evident to one of skill in the art.

Moreover, the method of forming a bonded substrate structure such as that illustrated in FIG. 7 provides a coating of the first and second glue material on the spacer structure without contaminating the device substrate. In embodiments in which the device substrate includes moveable MEMS devices, such as micro-mirror arrays, it is desirable to ensure that glues and other binding materials do not come into contact with the moveable devices, impairing their ability to perform as designed. Embodiments of the present invention provide methods and apparatus that separate the application and curing of the glue materials from steps involving the device substrate. Thus, the benefits provided by the first and second glue materials are achieved without contamination of the device substrate.

Figure 8:
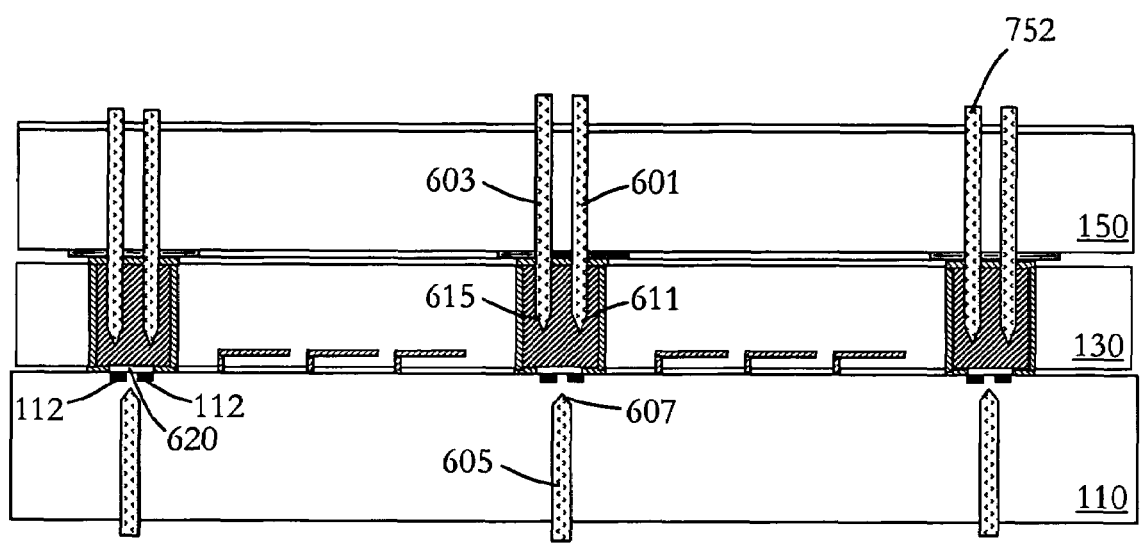
FIG. 8 is a simplified cross-sectional diagram illustrating a method for scribing a structure according to an embodiment of the present invention.

Referring now to FIG. 8, embodiments in accordance with the present invention provide a method that forms a plurality of scribe lines on selected portions of the bonded substrate structure 110. The method forms scribe line 607 as saw blade 605 cuts through a portion of the device substrate structure. The scribe line is through a thickness of the device substrate structure but does not cut all the way through the device substrate structure. The scribe line 607 is provided on a scribe region of the chip, which is on a wafer, with a plurality of chips.

The method forms a pair of scribe lines 611 and 615 through an entirety of the handle substrate 150 and through a portion of the standoff region of the spacer structure 130, as shown. As illustrated in FIG. 8, scribe lines 611 and 615 terminate in a portion of the standoff structures aligned with edges of contact regions 620 and the bond pads 112. Saw blades 601 and 603 cut through handle substrate 150 and through a portion of spacer structure 130. The scribed structure includes scribe lines 611, 615, and 607. Scribe lines 611 and 615 face each other with a thickness of material in-between. The thickness of material includes a portion of the handle substrate and a portion of the standoff structures.

As illustrated in FIG. 8 and described previously, the scribe lines 611 and 615 align with the edges of the contact regions and the bond pads. In embodiments in which the edges of the contact regions and the bond pads adjacent the MEMS devices are aligned, the scribe lines are aligned with edges of both the contact regions and the bond pads. In alternative embodiments, in which the width of the contact regions is greater than the combined width of the bond pads, the scribe lines may align with the edges of the contact regions adjacent the bond pads.

Figure 9:
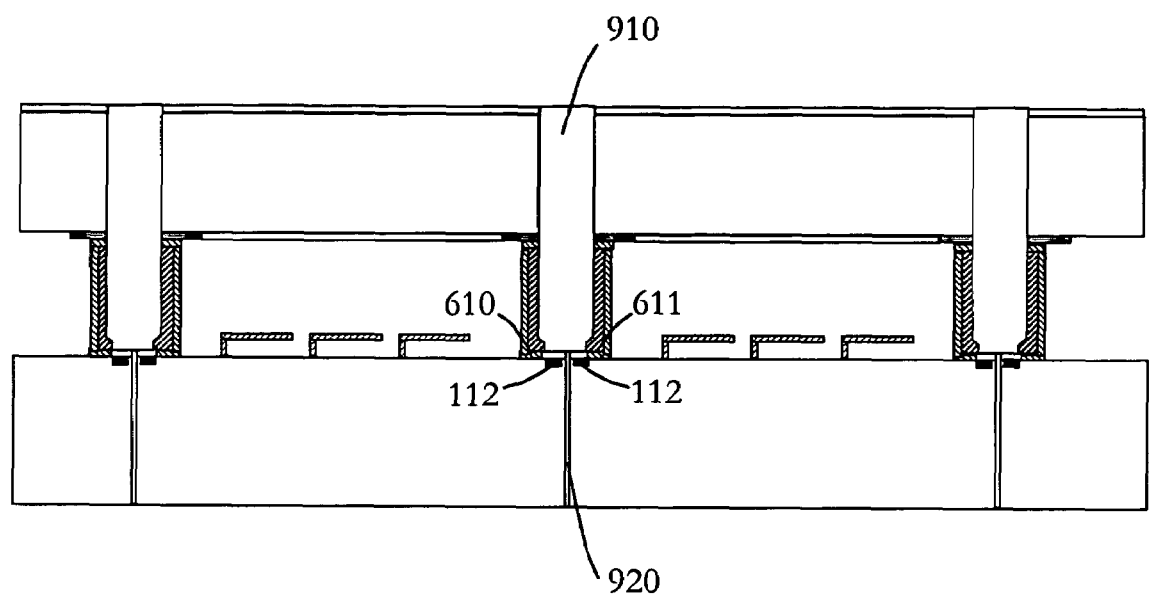
FIG. 9 is a simplified cross-sectional diagram illustrating a method of separating packages according to an embodiment of the present invention.

FIG. 9 is a simplified cross-sectional diagram illustrating a method of separating packages according to an embodiment of the present invention. Referring to FIG. 9, the method includes breaking a portion of the spacer structure and a portion of the device substrate structure. Preferably, breaking occurs via cleaving along crystal planes of the standoff structure and the device substrate structure. Since, as illustrated in FIG. 7, a portion 710 of the standoff structures is not attached to the device substrate structure, portion 910 is easily removed without damage to the bonding pads or other peripheral portions of the device substrate structure or the spacer structure. As illustrated in FIG. 9, the device substrate structure is broken along a plane defined by the scribe line 920.

Figure 10:
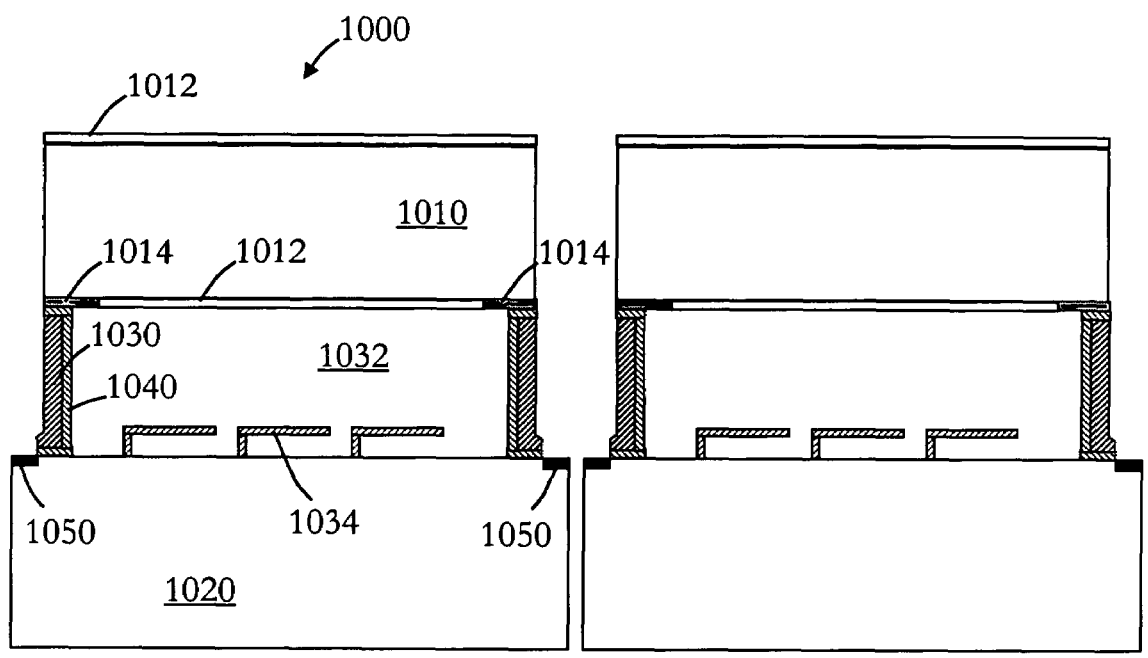
FIG. 10 is a simplified cross-sectional diagram illustrating two spatial light modulator packages according to an embodiment of the present invention.

FIG. 10 is a simplified cross-sectional diagram illustrating two spatial light modulator packages 1000 according to an embodiment of the present invention. In this embodiment of the present invention, the spatial light modulator package includes a transparent cover 1010 with AR coatings 1012 on upper and lower surfaces of the transparent cover, as well as light-blocking layers 1014 on the lower surface of the transparent cover adjacent to the lateral edges of the package.

The transparent cover 1010 is coupled to the device substrate 1020 through standoff regions 1030 adjacent to the lateral edges of the package. Standoff regions provide a hermetically sealed chamber 1032 in which an array of MEMS devices 1034 are sealed. In embodiments, of the present invention, a two-dimensional array of micro-mirror devices are coupled to device substrate 1020 and activated by electrodes (not shown) present on the device substrate. As illustrated in FIG. 10, layers 1040, which coat three sides of standoff regions 1030, provide a bonding surface at which a hermetic seal is formed at the transparent cover/standoff structure interface as well as the standoff structure/device substrate interface. Additionally, as discussed previously, the vertical portion of layer 1040 facing chamber 1032 acts as a passivation layer for the periphery of the sealed chamber. This passivation layer, generally characterized by a small amount of flaking and out-gassing, serves to preserve the hermetically sealed environment present in chamber 1032.

Bond pads 1050 are present on the device substrate and electrically coupled to the electrodes and MEMS devices through electrical leads (not shown) present on the device substrate. As illustrated in FIG. 10, bond pads 1050 are located outside the hermetically sealed chamber 1032 and yet provide for electrical connection between, for example, the integrated circuitry formed on the CMOS wafer and external drive electronics. Thus, electrical connections are provided between circuitry external to the hermetically sealed chamber and the devices located inside the hermetically sealed chamber.

It should be appreciated that the specific steps illustrated in FIGS. 1 through 10 provide a particular process flow according to one embodiment of the present invention. Other sequence of steps may also be performed according to alternative embodiments. For example, alternative embodiments of the present invention may perform the processing steps outlined above in a different order. For example, the order in which the substrates are processed may be varied, with the transparent substrate being processed prior to the device substrate structure or the spacer structure. Moreover, the individual steps illustrated by these figures may include multiple sub-steps that may be performed in various sequences as appropriate to the individual step. For example, the devices formed on the device substrate structure may include multiple device features that may be defined in various sequences within the scope of the present invention. Furthermore, additional processing steps may be added or removed depending on the particular applications. One of ordinary skill in the art would recognize many variations, modifications, and alternatives.

A method for packaging optical devices according to an embodiment of the present invention may be outlined as follows:

1. Provide a transparent substrate structure, the transparent substrate structure comprising a face region and an incident light region;

2. Provide a spacer structure, the spacer structure comprising a selected thickness of material, the spacer structure having a spacer face region and a spacer device region;

3. Provide a device substrate structure, the device substrate having a device face region and a device backside region;

4. Apply a first glue material to the spacer face region;

5. Bond the spacer face region to the face region of the transparent substrate structure;

6. Selectively apply a second glue material to the spacer device region;

7. Bond the spacer device region to the device face region; and

8. Perform other steps, as desired.

The above sequence of steps provides a method for packaging a optical device according to an embodiment of the present invention. As shown, the method uses a combination of steps including a way of applying a first and second glue material on selected portions of various structures to be bonded according to an embodiment of the present invention. Other alternatives can also be provided where steps are added, one or more steps are removed, or one or more steps are provided in a different sequence without departing from the scope of the claims herein.

Figure 11:
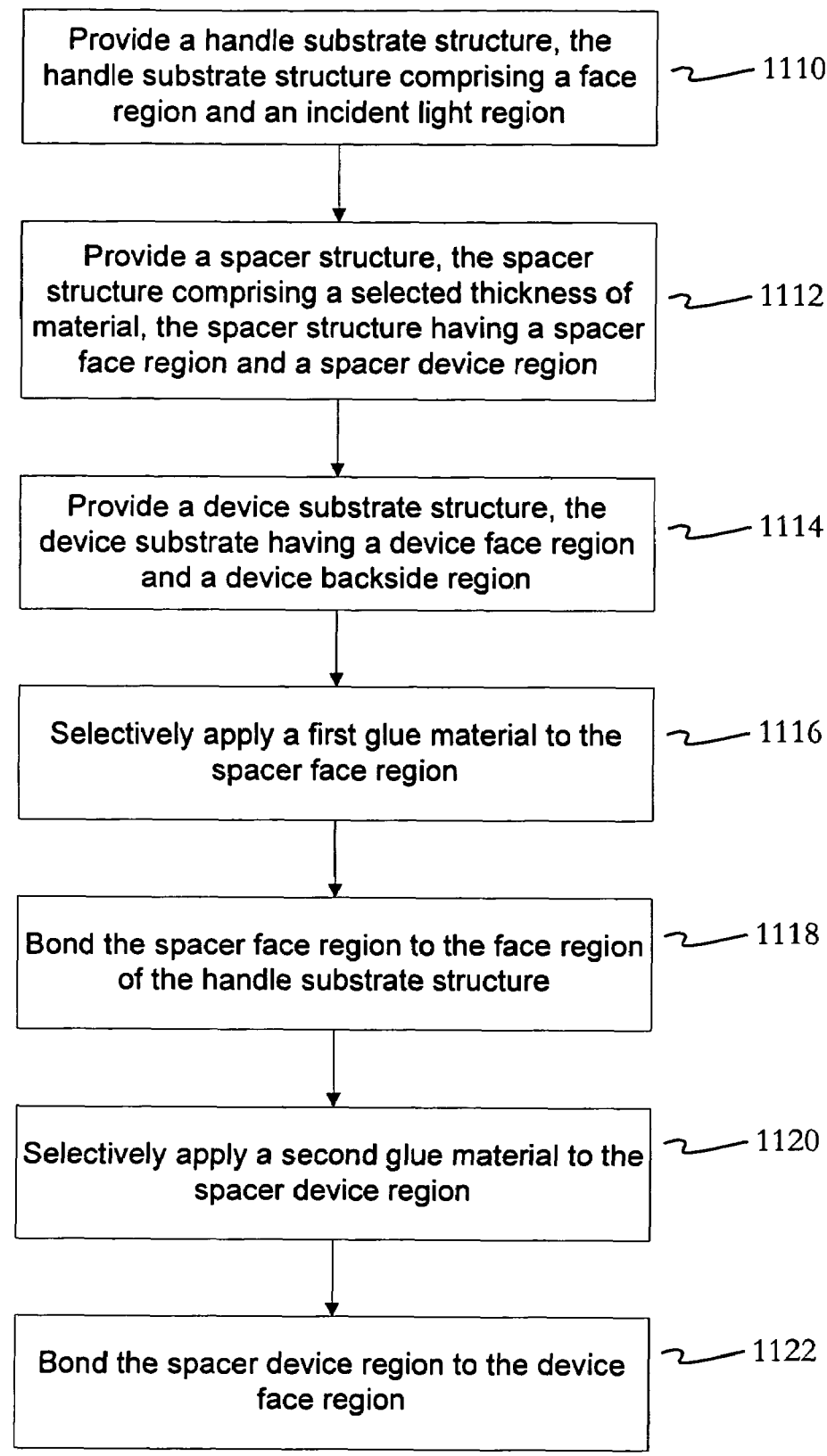
FIG. 11 is a simplified flowchart illustrating a method for packaging a optical device according to an embodiment of the present invention.

FIG. 11 is a simplified flowchart illustrating a method for packaging an optical device according to an embodiment of the present invention. In step 1110, a handle substrate is provided. In one embodiment, the handle substrate structure is a transparent substrate that is transparent to visible radiation and includes a face region and an incident light region. A spacer structure is provided in step 1112. Generally, the spacer structure includes a selected thickness of material, the spacer structure having a spacer face region and a spacer device region. In a specific embodiment, the spacer structure is a single crystal silicon wafer formed to include a grid providing standoff regions surrounding a number of open windows.

In step 1114, a device substrate structure is provided, the device substrate having a device face region and a device backside region. In some embodiments, the device substrate structure is a CMOS wafer including a number of moveable micro-mirrors and associated electrodes and control circuitry adapted to actuate the micro-mirrors. A first glue material is selectively applied in step 1116 to the spacer face region of the spacer structure. In a particular embodiment, the first glue material is a spin on glass (SOG) material sprayed onto the spacer structure while the spacer structure is rotated about an axis. During this spray coating process, the first glue material is applied to the spacer face region of the spacer structure as well as to portions of the sides of the standoff structures present in the spacer structure. In step 1118 the spacer face region of the spacer structure is bonded to the face region of the handle substrate structure. In some embodiments, a hermetic seal is formed during this bonding process.

A second glue material is selectively applied to the spacer device region of the spacer structure in step 1120. In a particular embodiment, the second glue material is a spin on glass (SOG) material sprayed onto the spacer structure while the spacer structure is rotated about an axis. During this spray coating process, the second glue material is applied to the spacer device region of the spacer structure as well as to portions of the sides of the standoff structures present in the spacer structure. In step 1122, the spacer device region is bonded to the device face region. In some embodiments, a hermetic seal is formed during this bonding process.

The above sequence of steps provides a method for packaging a optical device according to an embodiment of the present invention. As described, the method uses a combination of steps including a way of applying a first and second glue material on selected portions of various structures to be bonded according to an embodiment of the present invention. Other alternatives can also be provided where steps are added, one or more steps are removed, or one or more steps are provided in a different sequence without departing from the scope of the claims herein. In particular, hermetic bonding of the substrates is performed at the same time in one specific embodiment according to the present invention.

The examples and embodiments described herein are for illustrative purposes only. Various modifications or changes in light thereof will be suggested to persons skilled in the art and are to be included within the spirit and purview of this application and scope of the appended claims. It is not intended that the invention be limited, except as indicated by the appended claims.

What is claimed is:

1. A method for bonding substrate structures, the method comprising:
   providing a transparent substrate structure, the transparent substrate structure comprising a face region and an incident light region;
   providing a spacer structure, the spacer structure comprising a selected thickness of material, the spacer structure having a spacer face region, a spacer device region, and a plurality of spacer side regions extending through the selected thickness of material between the spacer face region and the spacer device region;
   providing a device substrate structure, the device substrate having a device face region and a device backside region;
   applying a first glue material to the spacer face region;
   bonding the spacer face region to the face region of the transparent substrate structure;
   placing a mask in contact with the spacer device region, thereby defining a contact portion of the spacer device region;
   selectively applying a second glue material to a bonding portion of the spacer device region and a portion of the plurality of spacer side regions;
   removing the mask to thereby expose the contact portion of the spacer device region as substantially free from the second glue material; and
   bonding the spacer device region to the device face region.

2. The method of claim 1 wherein the first glue material and the second glue material comprise spin on glass.

3. The method of claim 2 wherein the spin on glass is sprayed on the spacer face region and the spacer device region.

4. The method of claim 3 wherein the spin on glass is provided at a thickness of about 10 nanometers to about 5 microns.

5. The method of claim 2 wherein the transparent substrate structure is maintained free from any spin on glass before the bonding.

6. The method of claim 2 wherein the device substrate structure is maintained free from any spin on glass before the bonding.

7. The method of claim 1 wherein the first glue material and the second glue material are provided by a spray.

8. The method of claim 1 wherein the first glue layer and the second glue material are provided in a fluid state and dried using a curing process.

9. The method of claim 1 wherein the spacer structure comprises a plurality of openings, each of the openings being through an entirety of the selected thickness of material.

10. The method of claim 1 wherein the step of bonding the spacer face region to the face region of the transparent substrate structure comprises an anodic bonding process.

11. The method of claim 10 wherein the step of bonding the spacer device region to the device face region comprises an anodic bonding process.

12. The method of claim 1 wherein the step of bonding the spacer face region to the face region of the transparent substrate and the step of bonding the spacer device region to the device face region are performed simultaneously.

13. The method of claim 1 wherein the step of bonding the spacer face region to the face region of the transparent substrate and the step of bonding the spacer backside region to the device face region are performed at a temperature of less than about 300° C.

14. A method for bonding multiple substrates, the method comprising:
   providing a handle substrate, the handle substrate comprising a face region and an incident light region;
   providing a spacer substrate, the spacer substrate having a spacer face region, a spacer device region, and a plurality of spacer side regions extending between the spacer face region and the spacer device region;
   providing a device substrate, the device substrate having a device face region and a device backside region, wherein the device substrate comprises a plurality of bond pads on the device face region;
   providing a first conformal coating on the spacer face region;
   bonding the spacer face region to the face region of the handle substrate;
   masking a contact portion of the spacer device region using a mask to define a plurality of contact regions;
   providing a second conformal coating on a bonding portion of the spacer device region and on the plurality of spacer side regions, wherein the contact portion of the spacer device region is substantially free from the second conformal coating;
   removing the mask;
   aligning the plurality of bond pads with the plurality of contact regions; and
   bonding the spacer device region to the device face region.

15. The method of claim 14 wherein providing a first conformal coating on the spacer face region comprises applying a liquid to the spacer face region.

16. The method of claim 15 wherein applying a liquid comprises spraying an SOG solution on the spacer face region.

17. The method of claim 14 wherein providing a second conformal coating on the first portion of the spacer device region and the plurality of spacer side regions comprises applying a liquid to the first portion of the spacer device region and the plurality of spacer side regions.

18. The method of claim 17 wherein applying a liquid to the first portion of the spacer device region and the plurality of spacer side regions comprises spraying an SOG solution on the first portion of the spacer device region and the plurality of spacer side regions.

19. The method of claim 18 wherein the second conformal coating covers the first portion of the spacer device region and the plurality of spacer side regions, the first portion of the spacer device region and the plurality of spacer side regions being correlated with a shadow mask geometry.

20. The method of claim 14 wherein the handle substrate is transparent to visible radiation.

* * * * *